United States Patent
Matsumoto

(10) Patent No.: US 7,314,826 B2
(45) Date of Patent: Jan. 1, 2008

(54) SEMICONDUCTOR DEVICE AND METHOD OF FABRICATING THE SAME

(75) Inventor: Takanori Matsumoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 11/180,610

(22) Filed: Jul. 14, 2005

(65) Prior Publication Data
US 2006/0014360 A1    Jan. 19, 2006

(30) Foreign Application Priority Data
Jul. 14, 2004    (JP) .............................. 2004-207367

(51) Int. Cl.
*H01L 21/4763* (2006.01)

(52) U.S. Cl. .............................. 438/637; 257/E23.117; 257/E23.03

(58) Field of Classification Search ................ 438/637; 257/E23.117, E51.038, E23.03, E23.074
See application file for complete search history.

(56) References Cited

U.S. PATENT DOCUMENTS 5,562,801 A * 10/1996 Nulty .......................... 438/695
7,008,834 B2 * 3/2006 Nakai et al. ................. 438/197
2005/0124118 A1 * 6/2005 Smith et al. ................. 438/270

FOREIGN PATENT DOCUMENTS

| JP | 06291193 A | * 10/1994 |
| JP | 2000-323564 | 11/2000 |

* cited by examiner

*Primary Examiner*—Thao P. Le
(74) *Attorney, Agent, or Firm*—Oblon, Spivak, McClelland, Maier & Neustadt, P.C.

(57) ABSTRACT

A method of fabricating a semiconductor device includes forming a gate insulating film on an upper surface of a silicon substrate, forming a polycrystalline silicon film on the gate insulating film, and etching the polycrystalline silicon film, the gate insulating film, and the silicon substrate with a patterned coating type carbon film and a silicon nitride film so that first and second trenches are simultaneously formed. The first trench has a first width and a first depth and the second trench has a second width larger than the first width and the second depth larger than the first depth.

9 Claims, 4 Drawing Sheets

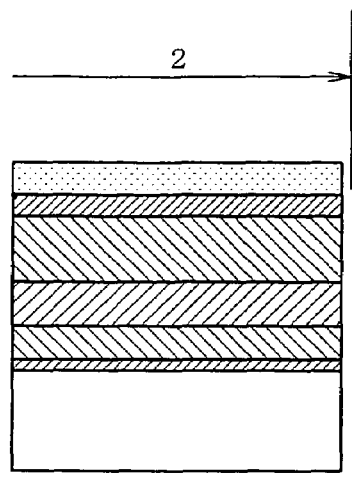
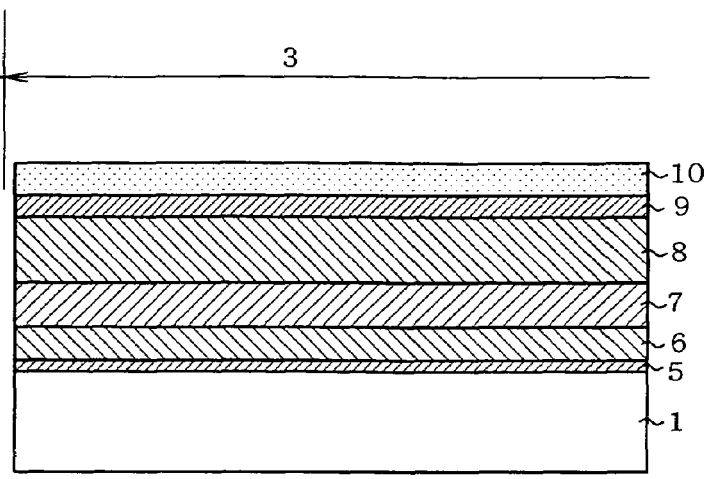
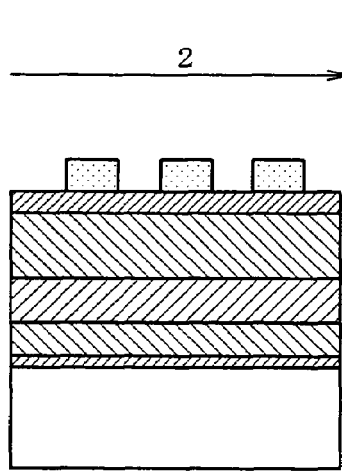
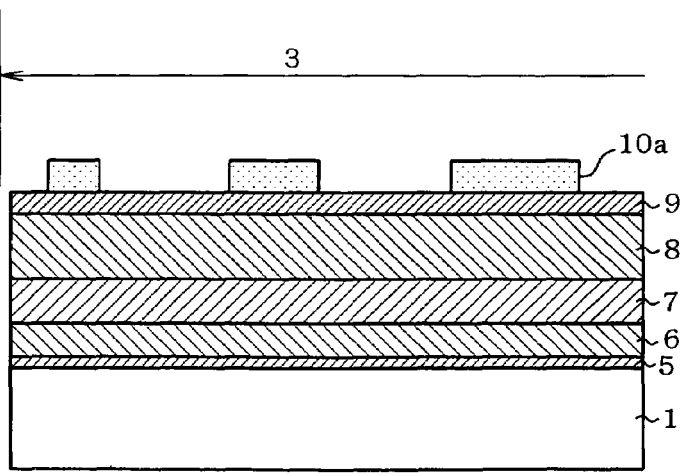

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2004-207367, filed on Jul. 14, 2004, the entire contents of which are incorporated herein by reference.

BACKGROUND OF THE INVENTION

1. Field of the Invention

The present invention relates to a semiconductor device having a plurality of trenches with different opening widths and a method of fabricating the semiconductor device.

2. Description of the Related Art

Semiconductor devices of the above-described type include a semiconductor storage device provided with a number of memory cell transistors, for example. One type of the memory cell transistor is formed with an element isolation region called "shallow trench isolation (STI)" in order that memory cell transistors and peripheral circuit transistors may electrically be isolated. The STI is formed by burying insulating films in a surface of a semiconductor substrate. Each transistor is formed in an active region isolated by the STI.

In a memory cell transistor forming region, a trench of the STI has a smaller width and a smaller depth in order that a degree of integration may be improved. The depth of the trench is rendered smaller in order that the insulating film may desirably be buried in the trench with a small opening width. Furthermore, regarding high-breakdown voltage transistors in the peripheral circuit region, the trench has a larger width and a larger depth than the trench at the memory cell transistor side in order that a prescribed breakdown voltage may be ensured.

In view of these limitations, trenches with different depths in a chip need to be formed in order that the STI may meet the above conditions. For this purpose, a photolithography process has conventionally been carried out twice so that a deep part and a shallow part have been individually formed.

However, carrying out the photolithography process twice is undesirable from the viewpoint of cost reduction. Furthermore, the photolithography process carried out twice results in a stepped portion due to etching in a boundary between the deeper and shallower trenches. A dummy region has conventionally been provided for preventing an element property from being adversely affected by the stepped portion.

JP-A-2000-323564 discloses a technique of carrying out the photolithography process only once even when the trenches with different depths are formed. In the disclosed technique, the photolithography process is carried out only once so that trenches having the same depth are formed in the memory cell region and the peripheral circuit region. A hydrogen heat treatment is carried out in a second half process of the semiconductor manufacture so that the bottom of the narrow trench is raised upward. As a result, the trenches having different depths are formed.

However, the hydrogen heat treatment is required although the photolithography process can be reduced. Accordingly, when a process in which a gate electrode is previously formed and separated by the forming of the element isolation regions, there is a possibility that the previously formed gate oxide film may be damaged by hydrogen anneal, whereupon the film quality may be reduced with the result of reduction in the reliability of elements.

BRIEF SUMMARY OF THE INVENTION

Therefore, an object of the present invention is to provide a semiconductor device in which the number of execution times of the photolithography process can be reduced by once but another step such as the hydrogen heat treatment need not be added, and a method of fabricating the semiconductor device.

In the present invention a method of fabricating a semiconductor device comprises forming a coating type carbon film on a silicon substrate, the coating type carbon film including not less than 80 weight % carbon, forming a resist film above the coating type carbon film, patterning the resist film according to plural trenches to be formed in the silicon substrate, patterning the coating type carbon film with the patterned resist film, and etching the silicon substrate with the patterned coating type carbon film so that the first and second trenches are simultaneously formed, the first trench having a first width and a first depth, the second trench having a second width larger than the first width and the second depth larger than the first depth.

The invention further provides a method of fabricating a semiconductor device comprising forming a gate insulating film on an upper surface of a silicon substrate, forming a polycrystalline silicon film on the gate insulating film, forming a silicon nitride film on the polycrystalline silicon film, forming a coating type carbon film on the silicon nitride film, the coating type carbon film including not less than 80 weight % carbon, forming a silicon oxide film on the coating type carbon film, forming a resist film on the oxide film, patterning the resist film by a photolithography process according to plural trenches to be formed in the silicon substrate, etching the silicon oxide film with the patterned resist film, etching the silicon nitride film with the patterned coating type carbon film, and etching the polycrystalline silicon film, the gate insulating film and the silicon substrate with the patterned coating type carbon film and the silicon nitride film so that the first and second trenches are simultaneously formed, the first trench having a first width and a first depth, the second trench having a second width larger than the first width and the second depth larger than the first depth.

BRIEF DESCRIPTION OF THE DRAWINGS

Other objects, features and advantages of the present invention will become clear upon reviewing the following description of the embodiment with reference to the accompanying drawings, in which:

FIGS. 2A and 2B are typical sectional views of the semiconductor device at a phase of the fabrication process (phase 1);

FIGS. 3A and 3B are typical sectional views of the semiconductor device at another phase of the fabrication process (phase 2);

DETAILED DESCRIPTION OF THE INVENTION

One embodiment of the present invention will be described with reference to the accompanying drawings. The invention is applied to a NAND flash memory in the embodiment. In a fabrication process of the NAND flash memory in the embodiment, trenches are formed in a semiconductor substrate which has previously been formed with part of film structure for a gate electrode. The structure of the semiconductor device in the trench forming steps and the fabrication process of the semiconductor device will hereinafter be described.

Figures 1A, 1B:
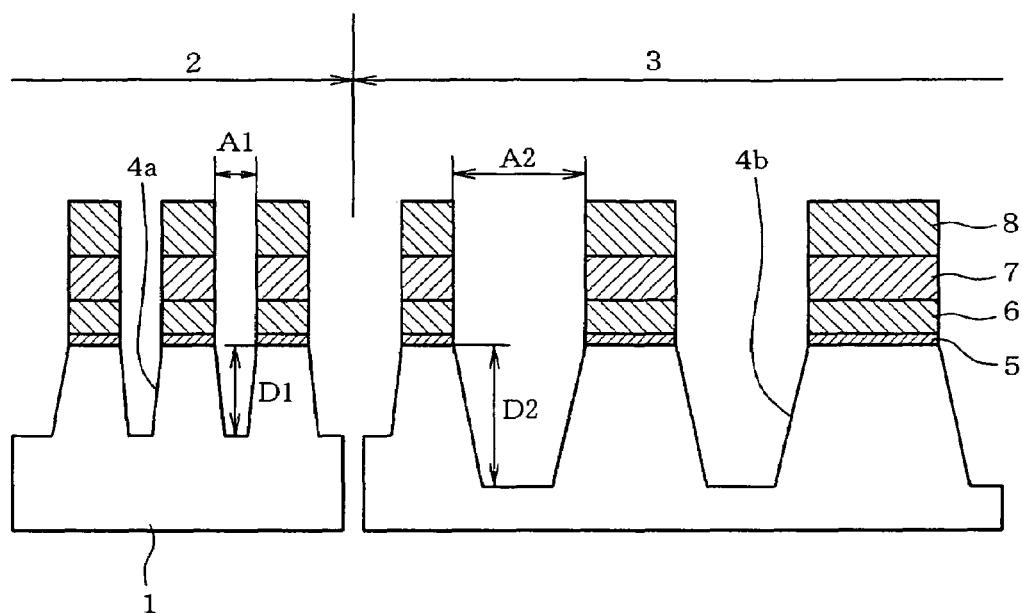
FIGS. 1A and 1B are schematic sectional views of a semiconductor device according to one embodiment of the invention, showing the condition immediately after completion of an etching process.

Referring to FIGS. 1A and 1B, schematic sectional views of the semiconductor device are shown. These views show the condition immediately after completion of an etching process. Trenches 4a and 4b are formed in a memory cell region 2 and a peripheral circuit region 3 so as to have different depths respectively. On an upper surface of the silicon substrate 1 are deposited a silicon oxide film 5 serving as a gate insulating film, a polycrystalline silicon film 6 composing a floating gate, a silicon nitride film 7 serving as a stopper in a chemical mechanical polishing (CMP) process, and a coating type carbon film 8 (a coating film containing carbon) sequentially. These films constitute parts of gate electrodes of the memory cell and peripheral circuit regions 2 and 3.

The coating type carbon film 8 will be described in conjunction with an etching process by a reactive ion etching (RIE) process. The coating type carbon film 8 is generally defined as a film which is formed by coating a chemical containing carbon (C) similar to photoresist and has not less than 80 weight % carbon after the baking. An ordinary resist film has a carbon content of about 70 weight %. Thus, the carbon content of the coating type carbon film 8 is higher than the ordinary resist film. Furthermore, the chemical of the coating type carbon film is a material similar to photoresist containing a high carbon content but cannot be exposed to light and developed as the photoresist is processed.

Reference symbol A1 in FIG. 1A designates a gap between memory cell transistors in the memory cell region 2, namely, an opening width of the trench. The opening width A1 is set according to the design standard which can ensure breakdown voltage and enables processing. Furthermore, reference symbol A2 in FIG. 1B designates a gap between high breakdown voltage transistors in the peripheral circuit region 3, namely, an opening width of the trench. The opening width A2 is set so as to be wider than the opening width A1 in order that the necessary breakdown voltage may be ensured.

Furthermore, the depth D1 of the trench 4a having the smaller opening width at the memory cell region 2 is smaller than the depth D2 of the trench 4b having the larger opening width at the peripheral circuit region 3. In the trench forming process, the trench 4a in the memory cell region 2 and the trench 4b in the peripheral circuit region 3 are simultaneously processed so as to have different depths.

The fabrication process for forming the trenches 4a and 4b will now be described with further reference to FIGS. 2A to 5B. Firstly, a silicon oxide film 5 serving as the gate insulating film is formed on the silicon substrate 1 so as to have a film thickness of 10 nm as shown in FIGS. 2A and 2B. The polycrystalline silicon film 6 is continuously formed on the silicon oxide film 5 so as to have a film thickness of 140 nm. The silicon nitride film 7 is formed on the polycrystalline silicon film 6 so as to have a film thickness of 90 nm. The polycrystalline silicon film 6 constitutes the floating gate. The remaining polycrystalline silicon film is formed after formation of the trenches. The silicon nitride film 7 functions as a stopper in the CMP process in the formation of the STI.

Subsequently, the silicon nitride film 7, the polycrystalline silicon film 6, the silicon oxide film 5 and the silicon substrate 1 are etched so that the photolithography process is carried out for formation of the trenches 4a and 4b. Firstly, a liquid phase of coating type carbon material 8 is coated on an upper surface of the silicon nitride film 7 and then baked at a baking temperature of 200° C. so that the coating type carbon film 8 having a film thickness of 450 nm is formed. In this case, a recommended baking temperature for the coating type carbon film 8 ranges from 50 to 600° C. The film thickness of the coating type carbon film 8 ranges from 300 to 500 nm.

Subsequently, a coating type oxide film 9 is coated on an upper side of the coating type carbon film 8 so as to have a film thickness of 100 nm and a resist 10 is formed on the upper side of the coating type carbon film 8. The coating type oxide film 9 is formed by coating a silica film forming coating liquid such as polysilazane.

Figures 4A, 4B:
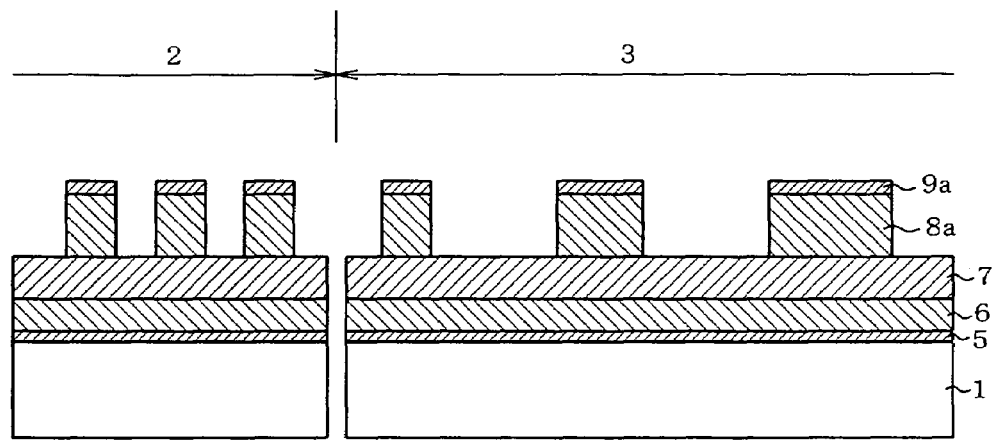
FIGS. 4A and 4B are typical sectional views of the semiconductor device at a further another phase of the fabrication process (phase 3)

The resist 10 is then exposed to light in a predetermined pattern and developed thereby to be formed into a resist pattern 10a, as shown in FIGS. 3A and 3B. The coating type oxide film 9 is then etched with the resist pattern 10a serving as a mask thereby to be formed into a coating type oxide film pattern 9a, as shown in FIGS. 4A and 4B. The coating type carbon film 8 is then processed with the coating type oxide film pattern 9a serving as a mask. A resist pattern 10a has already been etched thereby to disappear, and the coating type oxide film pattern 9a has been rendered thinner than at the film formation.

Figures 5A, 5B:
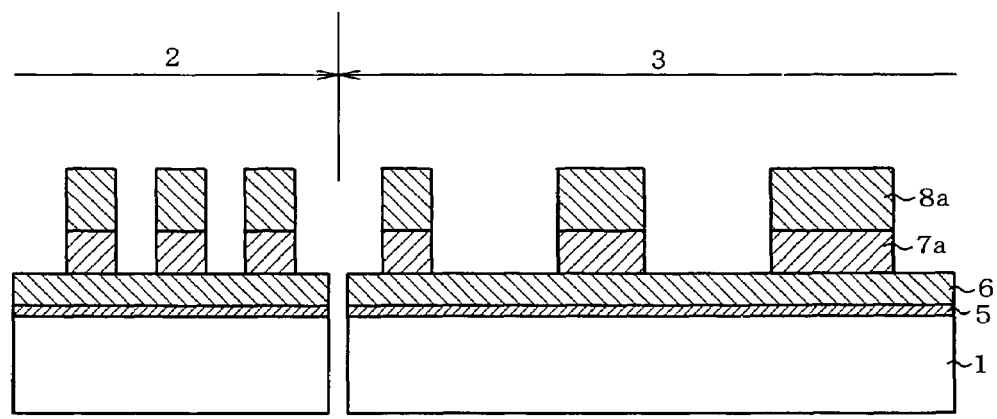
FIGS. 5A and 5B are typical sectional views of the semiconductor device at a still further another phase of the fabrication process (phase 4)

Subsequently, the silicon nitride film 7 is etched with the coating type oxide and carbon film patterns 9a and 8a serving as masks, as shown in FIGS. 5A and 5B. The coating oxide film pattern 9a has already been etched thereby to disappear, and the coating type carbon film pattern 8a has been rendered thinner than at the film formation.

The polycrystalline silicon film 6 and the silicon oxide film 5 are then etched with the patterns 8a and 7a serving as masks as shown in FIGS. 1A and 1B. The silicon substrate 1 is also etched until a predetermined depth is reached. In this case, normal silicon etching conditions are employed in the step of etching the silicon substrate 1. For example, hydrogen bromide (HBr), chlorine gas ($Cl_2$) and oxygen gas ($O_2$) are used at respective flow rates of 40 standard cubic centimeter per minute (SCCM), 90 SCCM and 30 SCCM. As a result, the depths of the trenches 4a and 4b differs from each other on the basis of the opening widths A1 and A2.

The following mechanism is conjectured when the etching process is carried out under the above-described conditions by the RIE process. Upon start of the etching process, silicon, Br ions and Cl ions react such that reaction products such as $SiBr\alpha$ and $SiCl\beta$ are produced. These reaction products should be evacuated. Not all the reaction product is evacuated but part of the reaction product tends to remain on the silicon substrate.

Furthermore, when carbon (C) contained in the coating type carbon film 8, Si, Br and the like react together, a reaction product such as SiBrCθ is also produced. Since the vapor pressure of the SiC reaction product is low, most of the SiC reaction product is deposited on the silicon substrate 1. On the other hand, part of the reaction product reacts with $O_2$ such that carbon is evacuated as COγ. Furthermore, since Cl ions react with a carbon film thereby to produce CCl product, an amount of Cl ion supplied to the silicon which is a film to be etched is reduced.

Etching progresses while deposited reaction product and the substrate 1 are dug down. Accordingly, an amount of deposited low-pressure SiC reaction product is necessarily increased in the memory cell region 2 such that a difference in the etching rate is produced as compared with the peripheral circuit region 3. More specifically, the etching rate in the memory cell region 2 becomes lower than the peripheral circuit region 3 by the microloading effect.

In an actually fabricated semiconductor device, the trench 4a with the depth D1 of 220 nm and the trench 4b with the depth D2 of 360 nm were formed by a single etching process. Thus, the depths which were 1.6 times larger were formed simultaneously. The reason for this is considered as follows: carbon C serving as a basic material of the reaction product is supplied from the coating type carbon film 8 employed as the mask material, whereupon the etching rate was lowered at the memory cell region 2 side.

The difference in the etching rate depends upon the use of the coating type carbon film 8 having a larger carbon content than the normal photoresist. As a result, trench depth D1<trench depth D2 when opening width A1<opening depth A2. Furthermore, the degree of difference in the etching rate depends upon a carbon content. In order to verify this dependence, the inventors measured data from the following samples. The samples included sample (1) in which a tetraethyl orthosilicate (TEOS) film was formed on a base obtained by depositing a silicon oxide film and a silicon nitride film on a silicon substrate in turn and which had a carbon content of 0 weight %, sample (2) in which a coating type carbon film A was formed on the base and which had a carbon content of A weight %, and sample (3) in which a coating type carbon film B was formed on the base and which had a carbon content of B weight % when B<A.

The TEOS film and coating type carbon films A and B formed on the three substrates were etched by the photolithography process so that a pattern having opening widths corresponding to the memory cell region and the peripheral circuit region respectively were formed. The etching process was carried out on the silicon substrate under the same conditions as described above.

Figure 6:
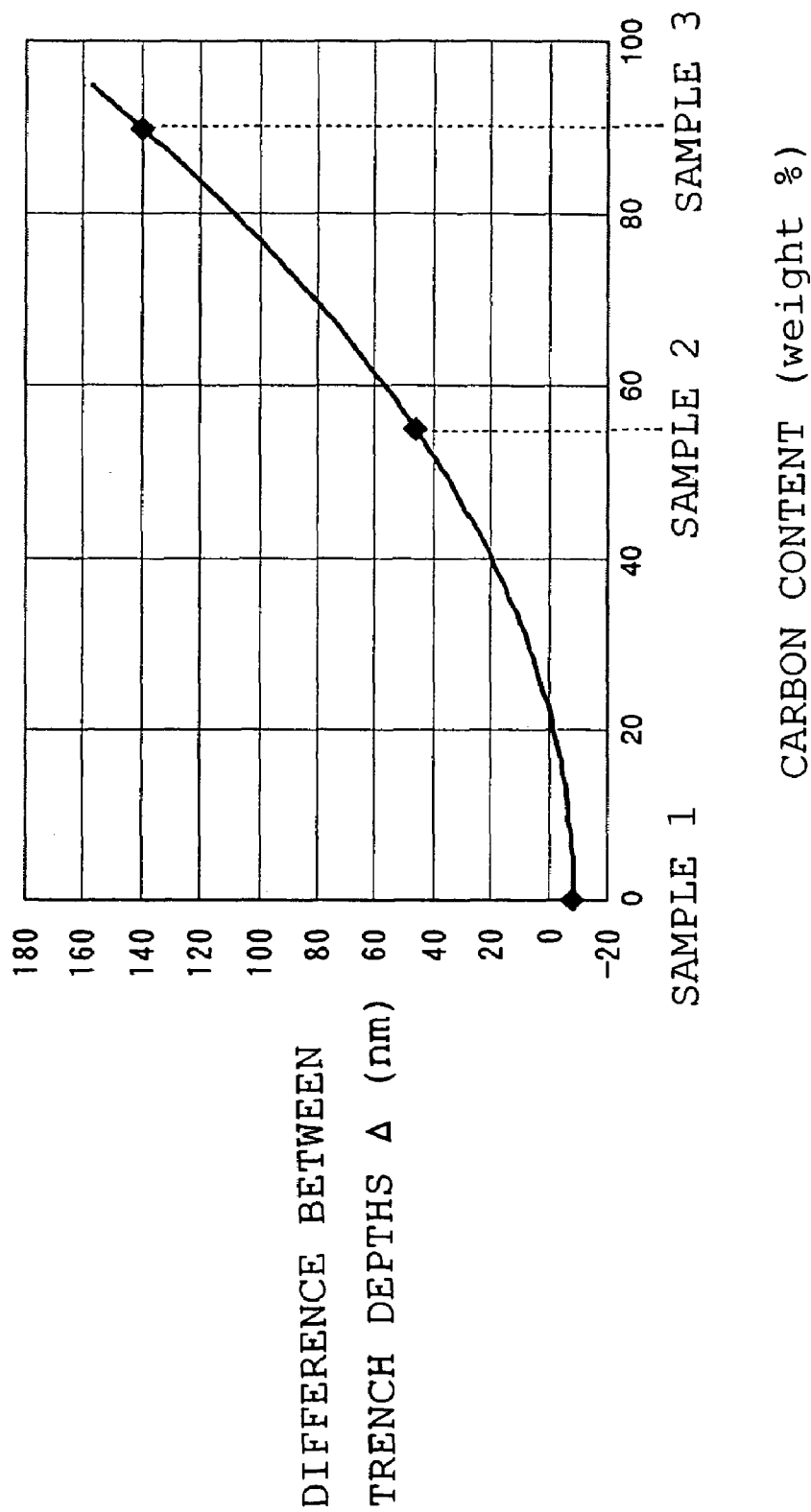
FIG. 6 is a graph showing the relationship between carbon content and the difference between trench depths.

Regarding the depths of trenches obtained as the result of the foregoing etching process, calculation was carried out to obtain the difference Δ (=D2−D1) between the trench depths D1 and D2 of the memory cell region and the peripheral circuit region respectively. FIG. 6 shows carbon content by weight % on the axis of abscissas and the difference Δ between the trench depths on the axis of ordinates. From the results as shown in FIG. 6, it is understood that the difference Δ changes according to a type of mask material or carbon content of mask material used in the forming of the trench. In other words, the difference Δ between the trench depths can be set to a desired level by selecting a carbon content of the mask material. This indicates that a plurality of trenches having desired different depths can simultaneously be formed by a single time of etching process. Consequently, a plurality of trenches having different depths can simultaneously be formed with high controllability.

The invention should not be limited to the foregoing embodiment. The above-described embodiment may be modified or expanded as follows. The invention should not be limited to the process of forming trenches of the NAND flash memory. The invention may be applied to all types of semiconductor devices in which a plurality of trenches have different depths.

The difference in the trench depth due to the difference in the opening width of the trench depends upon carbon content of the coating type carbon film 8 as described above. Additionally, there is a possibility that the difference in the trench depth may be changed by changing etching conditions. Thus, the carbon content and the etching conditions may be set in a complex manner so that a desired difference in the etching rate can be set, whereby the depths of the trenches can be controlled.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device comprising:
    forming a coating type carbon film on a substrate, the coating type carbon film including not less than 80 weight % carbon;
    forming a resist film above the coating type carbon film;
    patterning the resist film according to plural trenches to be formed in the silicon substrate;
    patterning the coating type carbon film with the patterned resist film; and
    etching the silicon substrate with the patterned coating type carbon film so that the first and second trenches are simultaneously formed, the first trench having a first width and a first depth, the second trench having a second width larger than the first width and a second depth larger than the first depth.

2. A method of fabricating a semiconductor device comprising:
    forming a gate insulating film on an upper surface of a silicon substrate;
    forming a polycrystalline silicon film on the gate insulating film;
    forming a silicon nitride film on the polycrystalline silicon film;
    forming a coating type carbon film on the silicon nitride film, the coating type carbon film including not less than 80 weight % carbon;
    forming a silicon oxide film on the coating type carbon film;
    forming a resist film on the oxide film;
    patterning the resist film by a photolithography process according to plural trenches to be formed in the silicon substrate;
    etching the silicon oxide film with the patterned resist film;
    etching the silicon nitride film with the patterned coating type carbon film; and
    etching the polycrystalline silicon film, the gate insulating film, and the silicon substrate with the patterned coating type carbon film and the silicon nitride film so that the first and second trenches are simultaneously formed, the first trench having a first width and a first depth, the second trench having a second width larger than the first width and a second depth larger than the first depth.

3. The method according to claim 1, wherein in the forming the coating type carbon film, the coating type carbon film is baked at a temperature ranging from 50° C. to 600° C.

4. The method according to claim 1, wherein in the etching the silicon substrate, the silicon substrate is etched by a reactive ion etching (RIE) method using hydrogen bromide gas, chlorine gas, and oxygen gas.

5. The method according to claim 2, wherein in the forming the coating type carbon film, the coating type carbon film is baked at a temperature ranging from 50° C. to 600° C.

6. The method according to claim 2, wherein in the etching the silicon substrate, the silicon substrate is etched by a reactive ion etching (RIE) method using hydrogen bromide gas, chlorine gas, and oxygen gas.

7. A method of fabricating a semiconductor device including a silicon substrate having a memory cell region and a peripheral circuit region, comprising:

forming a gate insulating film on an upper surface of a silicon substrate;

forming a polycrystalline silicon film on the gate insulating film;

forming a silicon nitride film on the polycrystalline silicon film;

forming a coating type carbon film on the silicon nitride film, the coating type carbon film including not less than 80 weight % carbon;

forming a silicon oxide film on the coating type carbon film;

forming a resist film on the silicon oxide film;

patterning the resist film by a photolithography process according to a first trench to be formed in the memory cell region and a second trench to be formed in the peripheral circuit region;

etching the silicon oxide film with the patterned resist film;

etching the coating type carbon film with the patterned silicon oxide film;

etching the silicon nitride film with the patterned coating type carbon film; and etching the polycrystalline silicon film, the gate insulating film, and the silicon substrate with the patterned coating type carbon film and the silicon nitride film so that the first and second trenches are simultaneously formed, the first trench having a first width and a first depth, the second trench having a second width larger than the first width and the second depth larger than the first depth.

8. The method according to claim 7, wherein in the forming the coating type carbon film, the coating type carbon film is baked at a temperature ranging from 50° C. to 600° C.

9. The method according to claim 7, wherein in the etching the silicon substrate, the silicon substrate is etched by a reactive ion etching (RIE) method using hydrogen bromide gas, chlorine gas, and oxygen gas.

* * * * *